United States Patent
Howard et al.

(10) Patent No.: US 6,730,609 B2
(45) Date of Patent: May 4, 2004

(54) ETCH AIDED BY ELECTRICALLY SHORTING UPPER AND LOWER SIDEWALL PORTIONS DURING THE FORMATION OF A SEMICONDUCTOR DEVICE

(75) Inventors: Bradley J. Howard, Boise, ID (US); Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 15 days.

(21) Appl. No.: 09/974,105

(22) Filed: Oct. 9, 2001

(65) Prior Publication Data

US 2003/0068896 A1 Apr. 10, 2003

(51) Int. Cl.$^7$ .............................................. H01L 21/302
(52) U.S. Cl. ..................... 438/706; 438/723; 438/724
(58) Field of Search ................................. 438/705, 706, 438/710, 714, 720, 723, 724

(56) References Cited

U.S. PATENT DOCUMENTS

| | | | | |
|---|---|---|---|---|
| 3,617,459 A | * | 11/1971 | Logan ................... | 204/192.23 |
| 4,307,180 A | * | 12/1981 | Pogge ........................ | 438/424 |
| 5,110,407 A | * | 5/1992 | Ono et al. ................... | 438/696 |
| 5,213,989 A | | 5/1993 | Fitch et al. ................... | 437/31 |
| 5,599,424 A | * | 2/1997 | Matsumoto et al. ......... | 438/738 |
| 5,686,357 A | | 11/1997 | Howard ....................... | 437/195 |
| 5,817,572 A | * | 10/1998 | Chiang et al. ............... | 438/624 |
| 5,905,280 A | * | 5/1999 | Liu et al. ..................... | 257/301 |
| 6,037,239 A | * | 3/2000 | Jennings ..................... | 438/430 |
| 6,054,394 A | | 4/2000 | Wang ......................... | 438/753 |
| 6,117,726 A | | 9/2000 | Tsai et al. ................... | 438/242 |
| 6,144,074 A | * | 11/2000 | Akita ......................... | 257/355 |
| 6,171,964 B1 | | 1/2001 | Gonzalez et al. ........... | 438/694 |
| 6,175,129 B1 | | 1/2001 | Liu et al. ..................... | 257/301 |
| 6,177,328 B1 | | 1/2001 | Liu et al. ..................... | 438/398 |
| 6,217,704 B1 | * | 4/2001 | Kitagawa ............... | 156/345.33 |
| 6,222,273 B1 | | 4/2001 | Gonzalez et al. ........... | 257/774 |

* cited by examiner

Primary Examiner—Kin-Chan Chen
(74) Attorney, Agent, or Firm—Kevin D. Martin

(57) ABSTRACT

A method used to fabricate a semiconductor device comprises etching a dielectric which results in an undesirable charge buildup along a sidewall formed in the dielectric during the etch. The charge buildup along a top and a bottom of the sidewall can reduce the etch rate thereby resulting in excessive etch times and undesirable etch opening profiles. To remove the charge, a sacrificial conductive layer is formed which electrically shorts the upper and lower portions of the sidewall and eliminates the charge. In another embodiment, a gas is used to remove the charge. After removing the charge, the dielectric etch may continue. Various embodiments of the inventive process and in-process structures are described.

6 Claims, 5 Drawing Sheets

ETCH AIDED BY ELECTRICALLY SHORTING UPPER AND LOWER SIDEWALL PORTIONS DURING THE FORMATION OF A SEMICONDUCTOR DEVICE

FIELD OF THE INVENTION

This invention relates to the field of semiconductor manufacturing, and more particularly to a method used in the fabrication of a semiconductor device to provide a conductive plug or other feature. In-process structures resulting from the inventive method are also described.

BACKGROUND OF THE INVENTION

During the manufacture of a semiconductor device such as a dynamic random access memory (DRAM), static RAM (SRAM), and other memories, microprocessors, and logic devices, several structures are commonly formed. For example, contact openings in one or more dielectric layers are typically used to expose an underlying layer such as a conductive land. A conductive layer is then formed within the opening to contact the land and to provide electrical access to the pad. Trenches are also formed, for example to define conductive interconnects.

FIGS. 1 and 2 depict a process to form openings to conductive lands. FIG. 1 depicts a wafer substrate assembly 10 comprising a semiconductor wafer 12 with conductive lands 14, a first dielectric layer 16 between about 2,000 angstroms (Å) and about 2,600 Å thick, for example about 2,300 Å thick, and a second dielectric layer 18 between about 3,000 Å thick and about 3,600 Å thick, for example about 3,300 Å thick. FIG. 1 further depicts conductive polysilicon pads 20 which are electrically coupled with lands 14. Also depicted in FIG. 1 is a first borophosphosilicate glass (BPSG) layer 22 between about 15,000 Å and about 15,600 Å thick, preferably about 15,300 Å thick. Further depicted is a second BPSG layer 23 between about 2,700 Å and about 3,300 Å thick, for example about 3,000 Å thick, and portions of a polysilicon capacitor top plate 24 between about 500 Å and about 700 Å thick, for example about 600 Å thick. The capacitor top plate comprising portions 24 is formed after forming BPSG 22, and prior to forming BPSG 23.

Next, a patterned photoresist layer 26 is formed which defines openings 28 which overlie the conductive pads 20. Other structures may also be formed which are not depicted depending on the type of device, such as storage capacitors for use with a dynamic random access memory (DRAM) device. FIG. 1 is generally to scale, except the photoresist will be between about 6,000 Å and 8,000 Å thick for this exemplary structure. The spacing between each photoresist feature 26 is about 2,700 Å and the pitch is about 6,700 Å.

After forming the structure of FIG. 1, a vertical anisotropic oxide dry etch is performed to remove the exposed BPSG 22, 23 in an attempt to result in the structure of FIG. 2. A portion of the photoresist, typically about 90% is removed during the etch.

Various problems can occur during the etch of the BPSG 23, 24 of FIG. 1. For example, while etching the openings there is a tendency for a positive charge to build up at the bottom of the openings while a negative charge is generated at the top. As a result, positively charged ions which are used to etch the openings have difficulty reaching the bottom of the opening where they are needed to continue etching the openings to expose the conductive lands 20. This can result in a slowing or cessation of the etch before the material is completely removed from the lands or other features, and can also result in profile anomalies.

A method which reduces or eliminates the problems described above would be desirable.

SUMMARY OF THE INVENTION

The present invention provides a new method which, among other advantages, reduces problems associated with the manufacture of semiconductor devices, particularly problems resulting from electrical charges building up along an opening during a dielectric or other etch. In accordance with one embodiment of the invention an etch is performed in a dielectric layer as deep as possible before the charge buildup unduly interferes with the etching process. Then, conductive spacers are provided in the opening, for example by forming a chemical vapor deposited (CVD) metal layer into the openings, followed by a spacer etch. The spacers provide a conductive path between the negatively-charged top and the positively-charged bottom. Optionally, etching may then continue with the conductive spacers in place to assist in the charge recombination between the top and bottom of the feature. These steps may also be repeated two or more times until the desired trench depth is reached.

In an alternate embodiment, a gas additive is used during the etch process which will adsorb on the sidewalls of the etched features and allow improved electrical conduction along the sidewalls. The gas may run at a continuous flow during the process, pulsed, or run as a separate etch step, and various gasses may be used as detailed below.

Additional advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE PREFERRED EMBODIMENT

Figure 1:
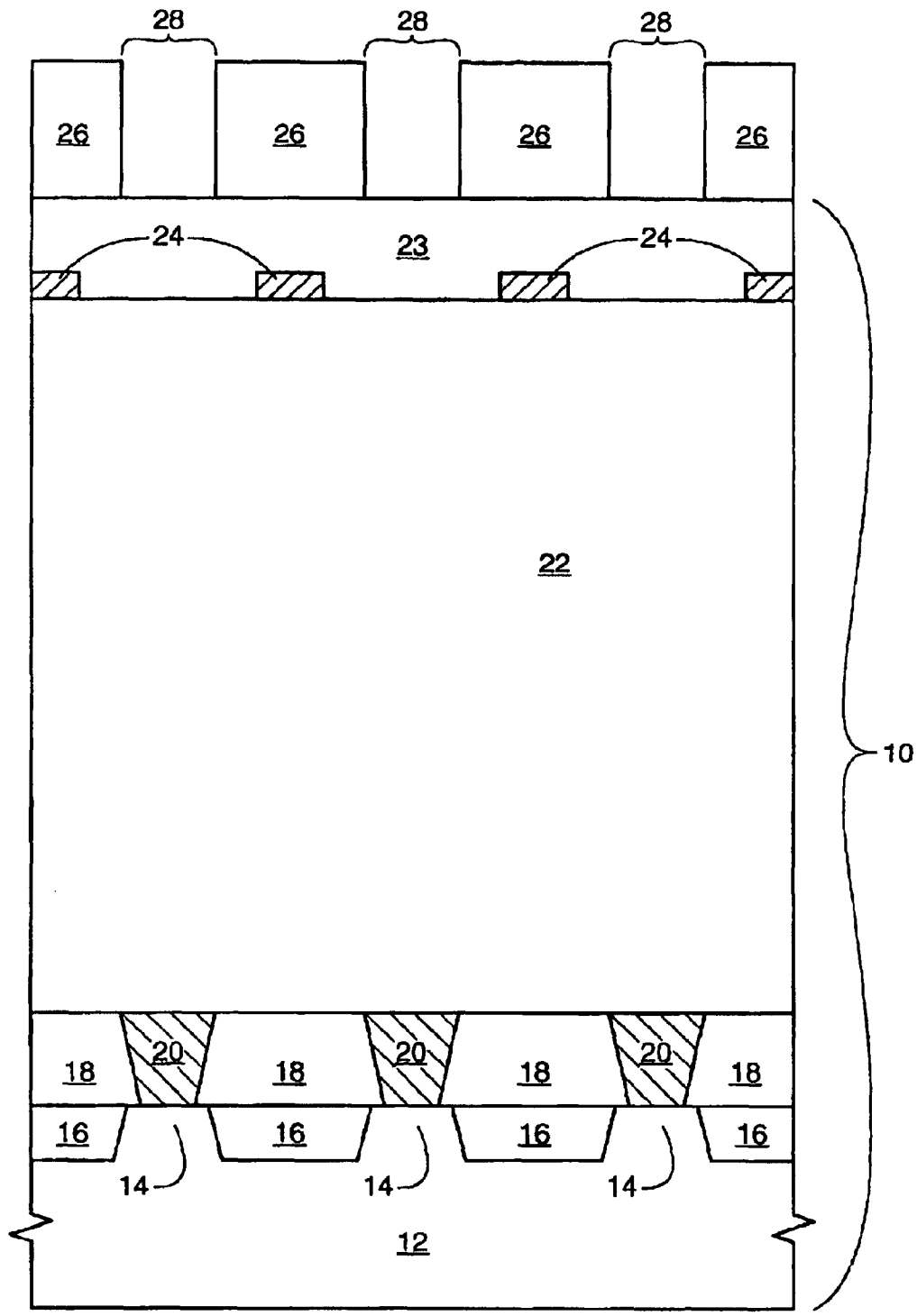
FIG. 1 is a cross section depicting a semiconductor substrate assembly which will be etched to expose conductive lands.
Figure 2:
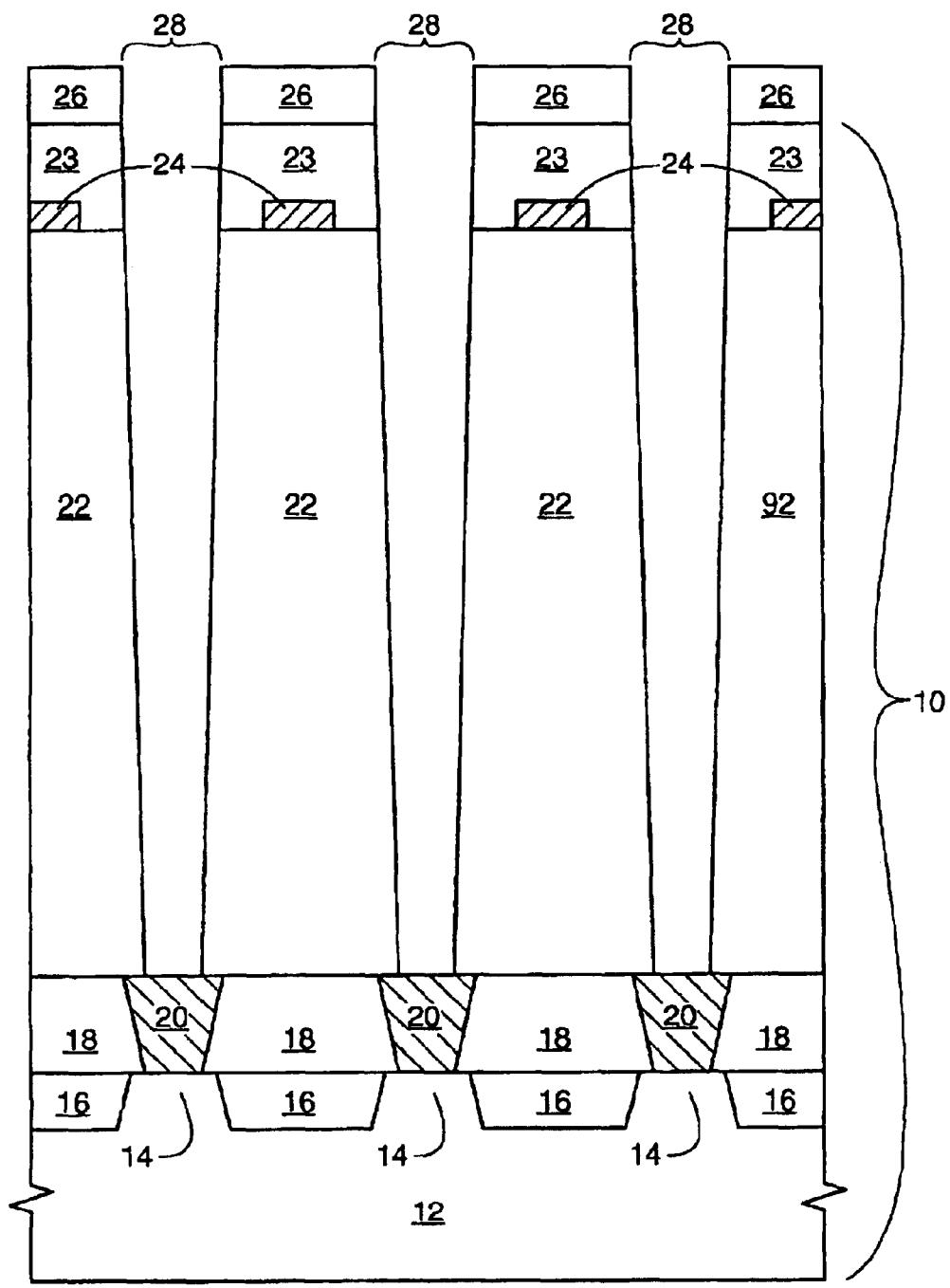
FIG. 2 is a cross section of the FIG. 1 structure after an etch to expose conductive lands.

A first exemplary embodiment of an inventive method used during the formation of a semiconductor device is depicted in FIGS. 1 and 3–5. The FIG. 1 structure is manufactured according to means known in the art. FIG. 1 includes a wafer substrate assembly 10 comprising a semiconductor wafer 12 with conductive lands 14, a first dielectric layer 16 and a second dielectric layer 18. FIG. 1 further depicts conductive polysilicon pads 20 which are electrically coupled with lands 14. Also depicted in FIG. 1 is a first borophosphosilicate glass (BPSG) layer 22, a second BPSG layer 23, and portions of a polysilicon capacitor top plate 24. The capacitor top plate comprising portions 24 are formed after depositing BPSG 22, and prior to depositing BPSG 23. Doped regions within layer 12, 14 are not depicted for simplicity of explanation.

Next, a patterned photoresist layer 26 is formed which defines openings 28 that overlie the conductive pads 20. FIG. 1 is generally to scale for this exemplary embodiment, except the photoresist 26 will be between about 6,000 Å and 8,000 Å thick. The spacing between each individual photoresist feature 26 is about 2,700 Å and the pitch is about 6,700 Å.

Figure 3:
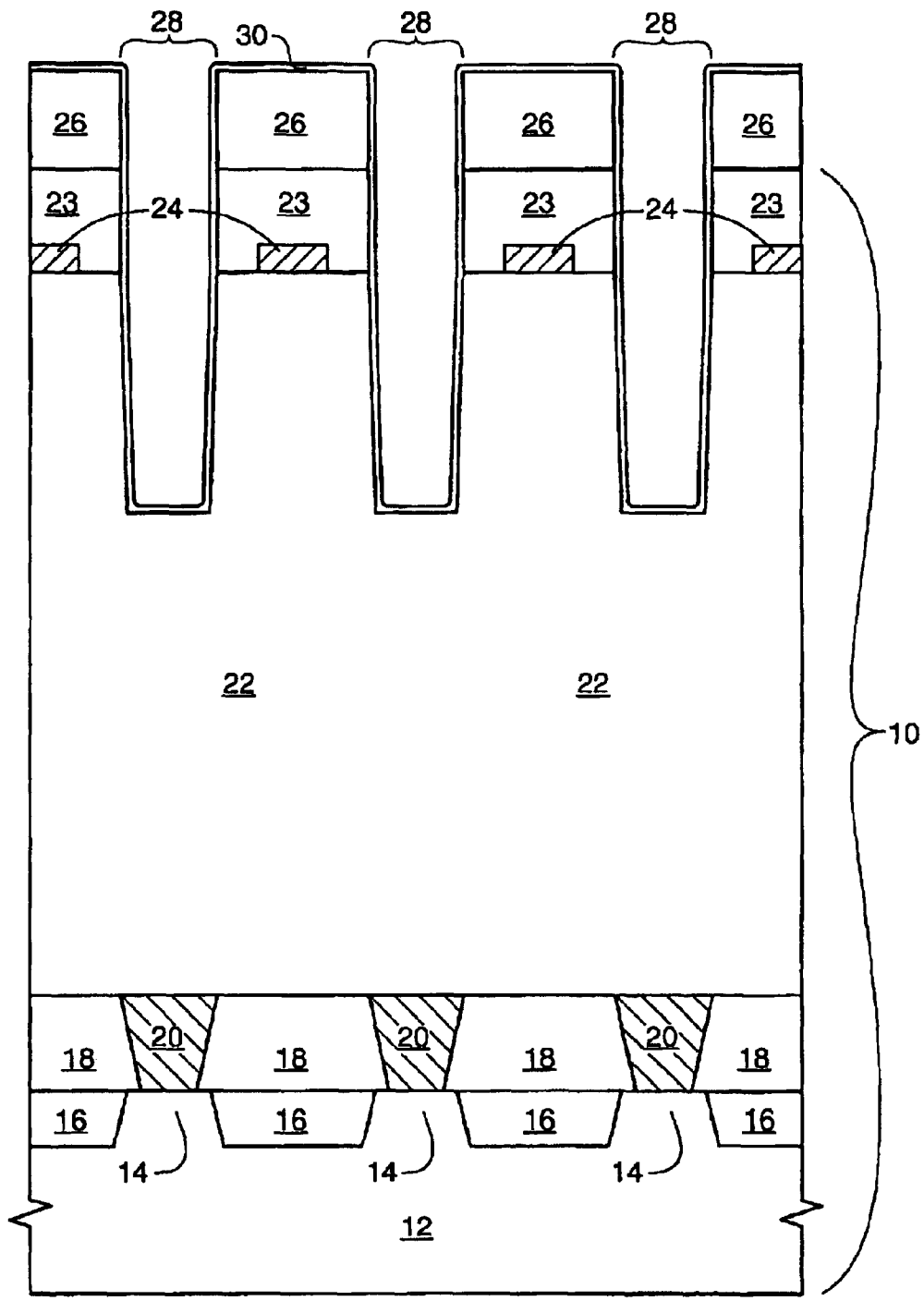
FIG. 3 is a cross section depicting partially-etched openings having a blanket conductive spacer layer formed over the surface of the assembly. The conductive spacer layer electrically shorts the sidewalls at the top of the openings with the sidewalls at the bottom of the openings.

After forming the structure of FIG. 1, a vertical anisotropic oxide dry etch is performed, for example using $CF_4$, $CHF_3$, and argon at a flow rate of between about 50 standard cubic centimeters (sccm) and about 500 sccm to remove a portion of the exposed BPSG 22, 23 as depicted in FIG. 3. This etch forms a plurality of openings 28 in the dielectric 23, 24 each of which comprises first and second cross-sectional sidewalls. In this embodiment the sidewalls are cross-sectional as each opening is typically round or oval when viewed from the top, and in actuality only one continuous sidewall is formed.

While etching the dielectric layers 22, 23 there is a tendency for a positive charge to build up toward the bottom of the sidewalls and for a negative charge to build up at the top. As a result, positively charged ions used to further etch the openings have difficulty reaching the bottom of the features. With this embodiment of the invention, layers 22 and 23 are etched as deep as possible before an electrical charge is built up along the sidewalls of the dielectric at a potential sufficient to excessively reduce the effectiveness of the etch. If layer 23 is very thick, it is possible that only a portion of layer 23 will be etched and layer 22 will not be etched at all during this initial etch. FIG. 3 depicts about half the total thickness of layers 22 and 23 etched, but the actual depth of this initial etch depends on etch and structural device parameters.

After the initial etch is completed as depicted in FIG. 3, a conductive blanket layer 30 is formed over the exposed wafer substrate assembly. The material of conductive layer 30 may comprise any number of conductive layers, such as a chemical vapor deposited (CVD) titanium layer, conductively doped polysilicon, or titanium nitride. With the instant embodiment, a layer between about 50 Å and about 250 Å, more preferably between about 50 Å and about 200 Å, and most preferably between about 50 Å and about 150 Å, is desirable. Layer 30 will eliminate any charge buildup on the sidewalls of the openings by shorting together the negatively charged upper sidewall portions with the positively charged lower sidewall portions. The conductive layer is preferably formed in the etch chamber used during the formation of openings 28, but the wafer may also be moved to a separate deposition chamber if advantages are provided.

A conductive layer 30 of conductively-doped polycrystalline silicon between about 50 Å and about 150 Å may be formed by introducing silane gas ($SiH_4$) as a silicon source into the chamber at a flow rate of between about 400 sccm and about 600 sccm along with phosphine ($PH_3$) at a flow rate of between about 5 sccm and about 15 sccm at a temperature of between about 500° C. and about 600° C. for a duration of between about 2.5 minutes and about 15 minutes. Using this process the preferred material is formed at a rate of between about 10 Å/min to about 20 Å/min. Other particularly preferred materials include titanium and titanium nitride. These may be formed by standard plasma vapor deposition (PVD), CVD, or plasma enhanced chemical vapor deposition (PECVD) methods.

Figure 4:
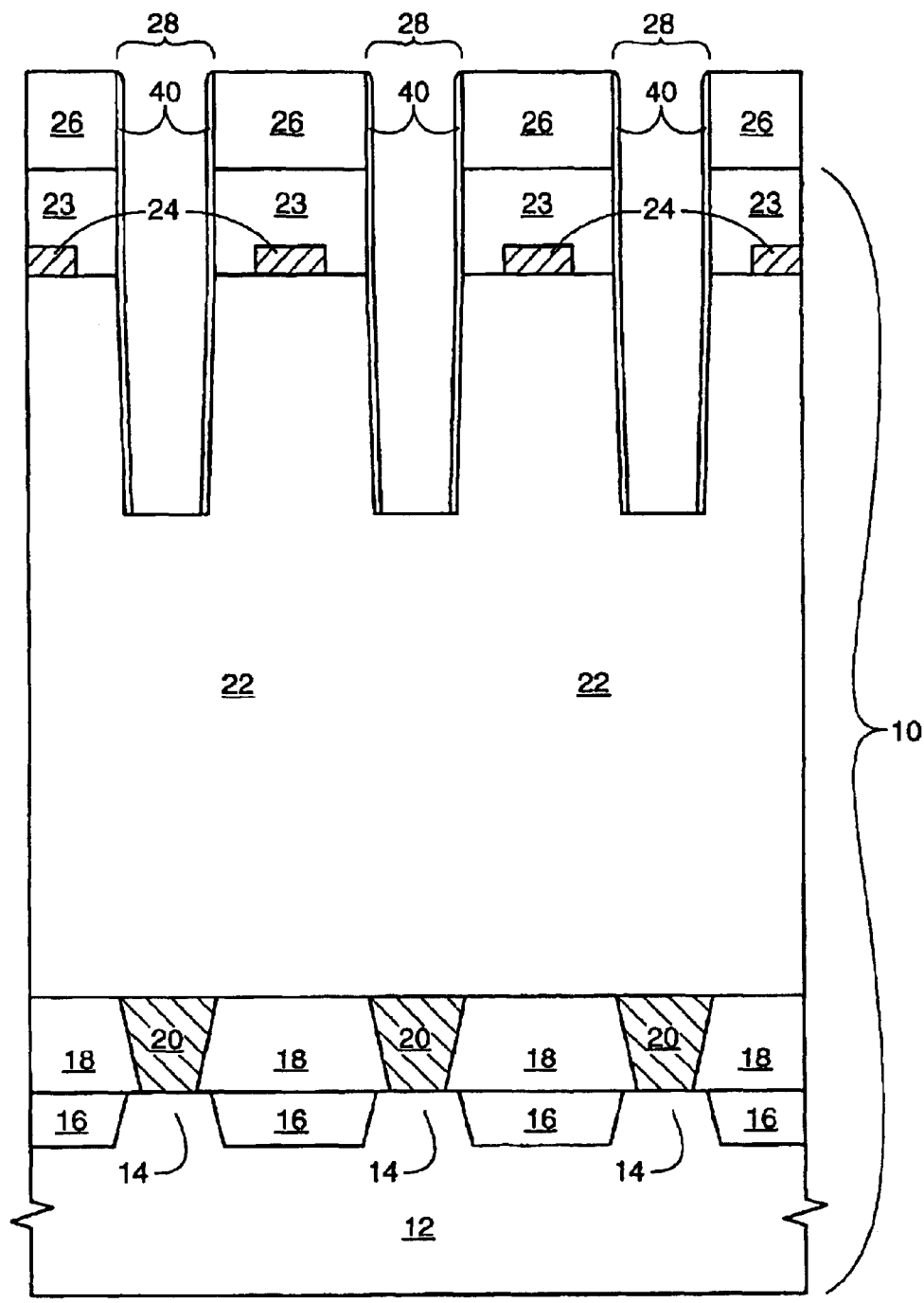
FIG. 4 depicts the FIG. 3 structure after performing a spacer etch.
Figure 5:
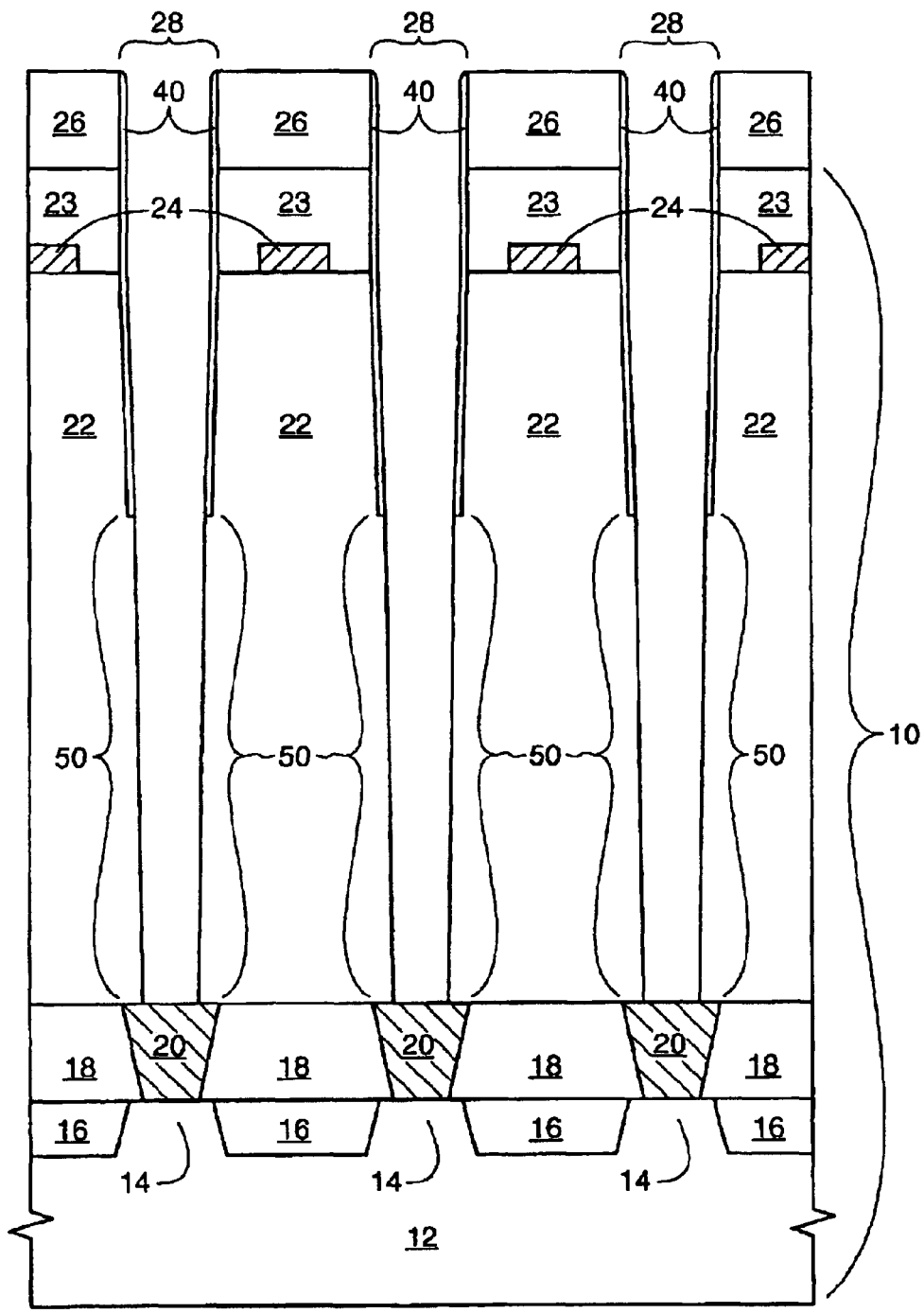
FIG. 5 depicts the FIG. 4 structure after the etch of the dielectric layer is completed to expose conductive lands.

The anisotropic dielectric etch may be continued without first removing the conductive layer 30 which results in conductive spacers 40 as depicted in FIG. 4. After the horizontal portions of layer 30 are removed, the etch continues through the BPSG layer 22 to expose the conductive lands 20 as depicted in FIG. 5. The spacers in this exemplary embodiment, in addition to shorting together the upper and lower sidewall portions, may reduce the likelihood of lateral dielectric etching which can expose the capacitor top plate portions 24. However, the formation of spacers in various other uses may provide no additional utility, but are artifacts of the etch if layer 30 is not completely removed prior to continuing with the dielectric etch.

A process which partially etches dielectric 22, 23, forms layer 30 to dissipate the electrical charge, then completely removes conductive layer 30 before completing the etch to expose lands 20 is not believed to be desirable in most processes. It is believed that a charge would build up during an etch within one or two seconds if the spacers 40 are removed from the FIG. 4 structure prior to continuing the etch of layer 22 to expose pads 20. This would thus prevent etching at any reasonable rate. Therefore, the conductive layer 30 is not removed after its formation, but etching is continued with the conductive spacers 40 in place.

If the aspect ratio of openings 28 is excessively high, a negative charge can build up along the newly-formed sidewall portions 50 below the conductive spacers 40 with a positive charge at the bottom of the opening. If this occurs for a particularly high aspect ratio a second conductive layer (not depicted) can be formed over conductive spacers 40 and over sidewall portions 50 subsequent to forming the first conductive spacers 40. After forming the second conductive spacers, etching may be continued or completed.

In another embodiment, spacers 40 of FIG. 5 are sacrificial and are oxidized either before or, preferably, after completing the etch which exposes lands 20. If the conductive properties of the spacers interfere with the particular process, oxidizing them removes this conductive property. The conductive spacers are thereby effectively removed, even though they have only been converted to oxide. This oxide may then be removed or left in place, depending on the particular use of the invention. For example, if the capacitor top plate material 24 of FIG. 5 was inadvertently exposed during the etch of FIG. 1, any conductive plug material formed within openings 28 would be shorted with the capacitor top plate 24 through spacers 40. However, oxidizing spacers 40 prior to forming a plug material within openings 28 would aid in isolating top plate material 24 from any conductive plug material formed within openings 28.

In another embodiment a partial dielectric etch is completed as depicted in FIG. 3. Then, instead of forming a conductive layer 30, a gaseous component or "additive" is introduced into the etch chamber which electrically shorts the upper sidewall portions with the lower sidewall portions. This additive may comprise various materials, for example a bromine-containing gas such as hydrogen bromide (HBr) or an iodine-containing gas such as hydrogen iodide (HI). Either HBr, HI, or other bromine- or iodine-containing gasses may be introduced at a flow rate of between about 1 sccm and about 20 sccm, and more preferably at a flow rate of between about 1 sccm and about 15 sccm, and most preferably at a flow rate of between about 1 sccm and about 10 sccm. The additive is sufficiently conductive to remove the electrical potential which builds up along the cross-sectional sidewalls during the dielectric etch. After introducing the additive, it is removed by exhausting it from the chamber if the gas adversely affects the subsequent etch or the substrate assembly, or etching may continued without separately removing the additive if no adverse effects result.

In another embodiment, the additive may be continuously flowed into the etch chamber during the etch if it does not excessively interfere with the etch or the resulting structure. By continuously flowing the additive during the etch, any charge buildup is continuously removed from the sidewall. A gas flow rate of between about 1 sccm and about 20 sccm, and more preferably at a flow rate of between about 1 sccm and about 15 sccm, and most preferably at a flow rate of between about 1 sccm and about 10 sccm would be sufficient for a continuous flow of the additive.

In an alternate embodiment, the additive may be pulse flowed into the etch chamber during the etch itself, or the etch gas may also be pulsed into the chamber out of phase with the additive thereby allowing continuous alternating dielectric etch and shorting of the upper and lower portions of the sidewall. In this embodiment, a flow rate of the gas which removes the sidewall potential may be between about 1 sccm and about 20 sccm, and more preferably at a flow rate of between about 1 sccm and about 15 sccm, and most preferably at a flow rate of between about 1 sccm and about 10 sccm. The dielectric etch duration may be between about 15 seconds and about 2 minutes, and may be different depending on the structure being formed. After this initial etch, the dielectric etch is stopped and the additive is flowed, for example at a rate of between about 1 sccm and about 20 sccm for a duration of between about 5 seconds and about 30 seconds, which is believed to be sufficient to remove any charge. The dielectric etch is then restarted, and this alternating etching and shorting is continued until the etch is complete.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the etches will be modified to tailor the process for each individual structure being formed. It is therefore contemplated that the appended claims will cover any such modifications or embodiments as fall within the true scope of the invention.

What is claimed is:

1. A method used in the fabrication of a semiconductor device comprising:

providing a dielectric layer at a location over a conductive feature;

only partially etching said dielectric layer over said conductive feature to form a sidewall in said dielectric layer, said sidewall having upper and lower portions;

providing a conductive layer electrically which shorts said upper portion of said sidewall to said lower portion of said sidewall;

subsequent to providing said conductive layer, further etching said dielectric layer to expose said conductive feature; and removing said conductive layer from said upper and lower sidewalls.

2. The method of claim 1 further comprising removing said conductive layer from said upper and lower sidewalls subsequent to further etching said dielectric layer.

3. The method of claim 2 further comprising oxidizing said conductive layer to remove said conductive layer from said upper and lower sidewalls.

4. The method of claim 2 further comprising etching said conductive layer to remove said conductive layer from said upper and lower sidewalls.

5. A method used to form a semiconductor device comprising:

providing a first dielectric layer at a location over a conductive feature;

providing a second dielectric layer over said first dielectric layer and over said conductive feature;

etching said second dielectric layer to form an opening therein which exposes said first dielectric layer;

only partially etching said first dielectric layer to form an opening therein, wherein said openings in said first and second dielectric layers are defined by an upper sidewall portion in said second dielectric layer and a lower sidewall portion in said first dielectric layer;

forming a conductive spacer which contacts said upper sidewall portion in said second dielectric layer and said lower sidewall portion in said first dielectric layer to electrically short said upper sidewall portion to said lower sidewall portion;

subsequent to electrically shorting said upper sidewall portion and said lower sidewall portion, further etching said first dielectric layer to expose said conductive feature; and removing said conductive spacer.

6. The method of claim 5 further comprising oxidizing said conductive spacer to remove said conductive spacer.

* * * * *